United States Patent [19]

Johnston, Jr.

[11] 4,213,801
[45] Jul. 22, 1980

[54] OHMIC CONTACT OF N-GaAs TO ELECTRICAL CONDUCTIVE SUBSTRATES BY CONTROLLED GROWTH OF N-GAAS POLYCRYSTALLINE LAYERS

[75] Inventor: Wilbur D. Johnston, Jr., Holmdel, N.J.

[73] Assignee: Bell Telephone Laboratories, Incorporated, Murray Hill, N.J.

[21] Appl. No.: 23,697

[22] Filed: Mar. 26, 1979

Related U.S. Application Data

[63] Continuation of Ser. No. 840,161, Oct. 7, 1977, abandoned.

[51] Int. Cl.² .................. H01L 23/48; H01L 29/46
[52] U.S. Cl. ........................ 148/33.3; 136/89 TF;
     148/1.5; 148/33; 148/33.1; 148/174; 357/16;
     357/59; 357/65; 357/71; 427/87; 427/88;
     427/113
[58] Field of Search .............. 148/1.5, 33, 33.1, 33.3,
     148/33.4, 174; 136/89 TF; 357/16, 59, 65, 71;
     427/87, 88, 113

[56] References Cited

U.S. PATENT DOCUMENTS

| | | | |
|---|---|---|---|
| 3,078,328 | 2/1963 | Jones | 136/89 TF X |
| 3,368,125 | 2/1968 | Pasierb | 357/16 X |
| 3,433,684 | 3/1969 | Zanowick et al. | 148/33.4 |
| 3,484,312 | 12/1969 | Ermanis et al. | 357/67 X |
| 3,699,401 | 10/1972 | Tietjen et al. | 148/175 X |
| 3,753,804 | 8/1973 | Tijburg et al. | 357/71 X |
| 3,961,997 | 6/1976 | Chu | 148/174 |
| 3,993,533 | 11/1976 | Milnes et al. | 427/87 X |
| 4,011,583 | 3/1977 | Levinstein et al. | 357/67 |
| 4,053,350 | 10/1977 | Olsen et al. | 427/87 X |
| 4,074,305 | 2/1978 | Johnston et al. | 136/89 TF X |

FOREIGN PATENT DOCUMENTS

978439 12/1964 United Kingdom ............... 148/174 X

OTHER PUBLICATIONS

Crossley et al., "Progress in Thin Film GaAs Solar Cells" Conf. Rec. IEEE Photospecialists, Mar. 1967, pp. 160–178.
Vohl et al., "GaAs Thin-Film Solar Cells" IEEE Trans. Electron Dev., vol. Ed-14, No. 1, Jan. 1967, pp. 26–30.
Johnston et al., "Thin Film AlAs/GaAs on Graphite Solar Cells" Digest, IEEE Int'l Electron Dev. Mtg., Wash. D.C., Dec. 1976, pp. 461–464.
Jaros et al., "Understanding of Ohmic Contact . . . Ge Doping of N–GaAs" Solid-State Electronics, 1975, vol. 18, pp. 1029–1030.

*Primary Examiner*—L. Dewayne Rutledge
*Assistant Examiner*—W. G. Saba
*Attorney, Agent, or Firm*—Bruce S. Schneider

[57] ABSTRACT

Thin layers of polycrystalline n-type GaAs have been deposited on a conducting substrate such as graphite. These contacted GaAs layers exhibit desirable properties for device applications, i.e., adequate cohesion between the GaAs and the substrate, good electrical contact to the conducting substrate, and good nucleation of the GaAs on the substrate yielding pinhole free or near pinhole free GaAs layers composed of large grains. These properties are obtained by first depositing a very thin coating, a coating with a nominal thickness between 1000 Å and 250 Å, of a Group IV element, Ge, Si, or Sn, onto the conducting substrate and then depositing the GaAs over this thin layer.

17 Claims, 3 Drawing Figures

NOT COATED

Ge COATED

NOT COATED

Sn COATED

NOT COATED

Si COATED

OHMIC CONTACT OF N-GaAs TO ELECTRICAL CONDUCTIVE SUBSTRATES BY CONTROLLED GROWTH OF N-GAAS POLYCRYSTALLINE LAYERS

This is a continuation, of application Ser. No. 840,161 filed Oct. 7, 1977, now abandoned.

BACKGROUND OF THE INVENTION:

1. Field of the Invention

The invention concerns the contacting of an electrically conductive substrate with a semiconductor and particularly to contacting a thin polycrystalline semiconductor layer.

2. Art Background

The cost advantages of photovoltaic devices having thin polycrystalline semiconductor layers are attractive as compared to their single crystal counterparts. However, the additional problems associated with thin polycrystalline layers must be solved before these cost advantages are obtainable. A primary source of these problems involves forming a good electrical contact, i.e., a non-rectifying contact with low resistance, between the thin semiconductor layer of the device and the external circuit, while simultaneously maintaining the physical and electrical integrity of the entire device.

By necessity a conducting material, one exhibiting metallic electrical properties, is applied to a semiconductor material to make electrical contact. Often, this conductor-semiconductor interface produces a rectifying diode, i.e., a Schottky barrier. If such a barrier is formed, an unacceptably large breakdown voltage is generally needed to overcome it. For most typical photovoltaic device applications, such blocking voltages should be limited to not more than 0.05 V. The barrier at the conductor-semiconductor interface also often functions, in effect, as an unacceptably large resistance in series with the device.

The lack of structural strength inherent in polycrystalline films only compounds the problems of excessive blocking voltage and resistance. To provide adequate support, a thin film device is built by depositing successive polycrystalline semiconductor layers on a supporting substrate. Since this supporting substrate intervenes between a semiconductor region of the device and the external circuit, it is by necessity used as one of the electrical contacts to the device. The irregular grains and associated grain boundaries of the polycrystalline semiconductor do not conform, on a microscopic scale, to the specific structure of the supporting substrate. Therefore the resistance is higher than when better physical contact can be obtained. This effect is even more significant when the structure of the contacting material has an irregular structure as found for instance in graphite. (Compare the case where a single crystal semiconductor region, i.e., a region having, in essence, one grain and no grain boundaries is contacted by depositing a thin metal film which forms a regular crystal structure on the single crystal.) Thus, even if no blocking voltage is present, the specific resistance at the interface of a thin polycrystalline semiconductor layer and a supporting substrate is often greater than the maximum acceptable resistance, typically 2 ohm-$cm^2$, for common device applications.

The necessity of fabricating a polycrystalline device, i.e., a device having polycrystalline semiconductor regions forming the diode, by successive deposition of semiconductor layers upon a supporting substrate introduces further problems not encountered with a single crystal device. Typically a thin metal film is evaporated or electroplated onto a single crystal semiconductor to form a contact. (See for example, U.S. Pat. No. 2,995,475 dated Aug. 8, 1961 where single crystal GaAs is contacted.) The characteristics of the single crystal semiconductor region are unaffected by the microscopic structure of the contacting material. In the polycrystalline case, however, the material making electrical contact is also the substrate upon which deposition takes place. The nucleation and growth of the semiconductor film during deposition is thus profoundly affected by the microscopic structure of the support.

Generally, the more irregular the microstructure of the supporting substrate, the more irregular the nucleation process. For these substrates, such as graphite, the problem of irregular crystal growth is often the most pronounced, i.e., the substrate is only partially covered and discontinuous areas of deposited semiconductor having grains of varied sizes are formed. Indeed, in egregious cases, the semiconductor material either does not nucleate on or simply flakes off the substrate.

In the usual device configuration even a single pinhole in a semiconducotr layer is unacceptable. For example, in a liquid junction device a semiconductor electrode is immersed directly in a liquid electrolyte. If the semiconductor layer has a pinhole, the electrolyte fills it, contacts the supporting substrate, and shorts out the device. Similarly, in an all solid state device, if one semiconductor forming the rectifying junction has even a single pinhole, the second semiconductor forming the junction when deposited on the first, shorts through the pinhole to the substrate.

For other device configurations, other problems associated with poor area coverage occur. To overcome the blocking voltage and resistance problems previously discussed, a semiconductor material which does make low resistance contact to a particular substrate is sometimes deposited between the supporting substrate and another semiconductor layer of the device. (See copending application Ser. No. 742,519 filed Nov. 16, 1976 now U.S. Pat. No. 4,074,305.) This intermediary region deposited on the substrate does not have to be pinhole free since the objective is, indeed, to form a short between the substrate and this other semiconductor region. However the effectiveness of the intermediary layer in reducing resistance is diminished for each pinhole or discontinuity. Undesirably high resistances for most photovoltaic applications occur when less than 90% of the area undergoing deposition is covered. Although this puts less severe limitations on the nucleation process than the usual pinhole free requirement, even this 90% area coverage limitation is difficult to satisfy for common semiconductor materials and conducting substrates. For example, when a thin polycrystalline layer of n-GaAs is deposited on graphite a poor area coverage is obtained. (See Abstract No. 100 Philadelphia meeting *Electrochem. Soc.* May, 1977.) Finally, even assuming the appropriate area coverage is obtained, the grain size of the polycrystalline layer is often smaller than the minority charge carrier diffusion length, typically about 2$\mu$. In such situations, the device efficiency is again unacceptably reduced.

SUMMARY OF THE INVENTION

A means of avoiding the electrical contact and layer growth problems observed for deposition of polycrystalline n-GaAs on a conductive substrate has been found. A thin layer (nominal thickness in the range of 1000 Å to 250 Å) composed of group IVA elements, i.e., Si, Ge, and Sn, is first deposited on the conductive substrate. The polycrystalline n-GaAs is then deposited on this thin layer. Electrical contacts having this configuration exhibit blocking voltages below 0.05 V and specific resistances below 2 ohm-cm$^2$. The GaAs layers grow with an average grain size greater than 2$\mu$ and have an area coverage even on graphite of greater than 90%. Indeed, when Ge or Sn is used pinhole free layers (100% area coverage) are achievable. Thus, these contacted layers are well suited for applications such as GaAs liquid junction photovoltaic cells, or as intermediary contact layers.

DETAILED DESCRIPTION

Figure 1:
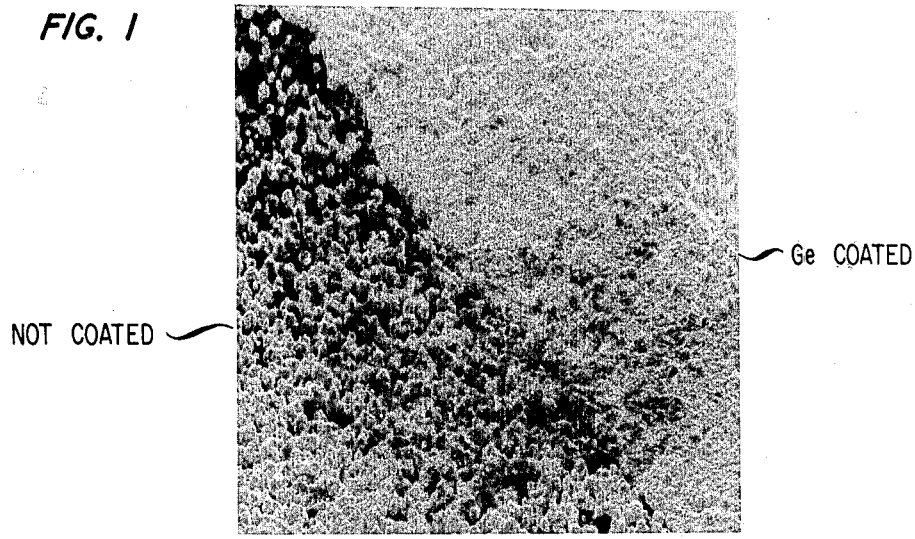
FIGS. 1-3 are scanning electron micrographs illustrating the GaAs crystal growth obtained when a layer of Ge, Sn, or Si, respectively, is used as compared to the same substrate without this layer.

The method employed for depositing the coating of the group IVA element, i.e., Ge, Sn, or Si onto the conductive substrate is not critical. For example, well known methods such as evaporation and sputtering are useful. The substrate is chosen to have a coefficient of expansion (in the temperature range between room temperature and the deposition reaction temperature) not so different from the GaAs coefficient of expansion that adhesion is prevented by dissimilar changes in overall dimension between the substrate and the GaAs. The substrate should also be chosen to be inert under the reaction conditions of the deposition process.

Exemplary of suitable substrates is high density graphite, e.g., 5890 PT, molded totally purified high density graphite sold by Carbone-Lorraine Ind. Corp. Boonton, N.J. The use of graphite is a preferred embodiment of the invention because of its low cost and inertness. Further, it is generally true that graphite is one of the most difficult conductive substrates on which to obtain suitable area coverage and electrical properties. For this reason, the remaining description is in terms of a graphite substrate. Analogous procedures for other substrates presenting a similar problem will be apparent to those skilled in the art.

Before deposition the substrate is cleaned to remove any foreign matter. For example, a graphite substrate is cleaned by rinsing in trichloroethane, followed by methanol rinse and then by firing in a hydrogen atmosphere of 1000 degrees C. The particular process chosen for deposition of the group IVA compound on the cleaned substrate is a matter of convenience. It has been found that for deposition of Ge and Sn, either a conventional evaporation technique or sputtering method is convenient. However, for Si, sputtering is more convenient than techniques such as evaporation because Si has a useful vapor pressure only at a relatively high temperature. Which ever technique is employed, deposition is continued until a layer with a nominal thickness in the range of 250 Å to 1000 Å, preferably a nominal thickness of 400 Å to 600 Å, is obtained. Layers having a nominal thickness greater than 1000 Å are generally uneconomical. Additionally, for layers having a nominal thickness greater than 1000 Å, coefficient of expansion differences start to become significant and separation of the group IVA element from the substrate is possible. For coatings having a nominal thickness less than 250 Å, coverage of the conducting substrate is generally inadequate and deterioration in the subsequently deposited GaAs layer begins. However, when using either Sn or Ge in situations where area coverages of 90% are acceptable, nominal thicknesses as low as 200 Å are useful. Layer thickness deposited on rough substrates, such as graphite are difficult to measure. The roughness of the substrate layer makes it impossible to set a reference level from which to measure the thickness. For this reason, to define the invention specifically, the nominal thickness figures given refer to the amount of group IVA material which would give the designated thickness when deposited on a polished glass surface, such as a microscope slide. During deposition a glass slide is coated along with the substrates. The thickness is then determined by monitoring the thickness of the layer on the slide by methods such as the Kronos crystal gauge or the Taly-Surf gauge (a needle whose deflection when moved from a coated to an uncoated region indicates the layer thickness).

In a preferred embodiment, the deposited layers are composed substantially of either Ge, Sn or Si. However, the invention includes situations where the layer is substantially composed of a combination of these three elements. When such composite layers are desired, it is convenient to deposit them by using a sputtering method such as Rf sputtering. A target of appropriate composition to produce the final desired composition is then easily determined by using a controlled sample. Since Si has a high melting point, it is convenient to deposit layers containing this element by sputtering rather than by techniques such as evaporation which rely on direct heating. Some contamination of the group IVA element layer is acceptable. Naturally, contaminants such as iron, which adversely affect the electrical properties of the GaAs, or such as copper which can quickly diffuse through the semiconductor layer, must be avoided. However, from the viewpoint of affecting the nucleation and growth process, contamination should generally be limited to less than 1%.

GaAs is then deposited upon the conductive substrate only after the deposition of a group IVA compound. (The time period between deposition of the group IVA element and the GaAs is not critical and periods as long as a month or longer are tolerable provided the treated substrates are stored in a dry environment.) A chemical vapor deposition apparatus suitable for deposition of GaAs according to this invention is described by Tietjen and Amick, in *J. Electrochem. Soc.* 113, 724 (1968). (See FIG. 1 of that paper.) However, unlike the procedure of the Tietjen paper, no H$_2$Se or PH$_3$ is introduced into the reaction chamber. (As discussed below, if higher carrier concentrations are desired H$_2$Se is, however, introduced as a dopant.) Additionally, since this invention contemplates only n-type GaAs layers, the Zn reactant which is a p-type donor is also not used. The HCl and AsH$_3$ are introduced into the reaction chamber in separate H$_2$ flows. The concentration of HCl or AsH$_3$ in their separate gas flows and the respective flow rates are not critical. Typically, a 2% concentration of HCl or AsH$_3$ with a flow rate between 100 and 400 cc/min (if measured in a 2¾ inch reaction tube) is adequate. The HCl gas flow is passed over a boat containing elemental Ga heated to a temperature between 500 degrees C. and 1200 degrees C., preferably between 700 degrees C. and 900 degrees C. The AsH$_3$ gas flow is begun before the introduction of the HCl gas flow to prevent etching of the group IVA element by HCl or GaCl$_2$. The flow containing HCl and the HCl-Ga reaction products is combined with the AsH$_3$ containing flow before it reaches the substrate. Therefore, by this order of processing destruction of the group IVA metal is prevented.

The HCl-Ga and AsH$_3$ flows are combined in the reaction zone which is heated to between 700 degrees C. and 900 degrees C. Pure hydrogen, if needed, is added in the reaction zone, to make the total flow rate between 100 and 3000 cm$^3$/min preferably between 500 and 1000 cm$^3$/min. The combined gas flow is then passed over the treated substrate which is heated to a temperature between 500 and 800 degrees C., preferably between 600 and 700 degrees C., Substantially, higher substrate temperatures are inappropriate with Ge or Sn since reaction of these elements to form volatile chloride compounds with subsequent evaporation become pronounced at these temperatures. (The above conditions are those found suitable for a reaction tube which is 5-feet long and 2¾ inches in inside diameter. A change in geometric configuration affects the end points of the ranges given. Additionally, there is an interdependence among reaction conditions, so, for example, a high flow rate ordinarily requires adjustment of the substrate temperature. A controlled sample is necessary to determine the best conditions for a given chamber geometry.)

The described process produces n-GaAs with majority carrier concentrations in the range between $10^{16}$ cm$^{-3}$ and $10^{17}$ cm$^{-3}$. It is possible to obtain higher majority carrier concentrations by introducing a dopant, for example, Se during the CVD deposition process. If this is desired, the dopant, for example Se, is introduced as an H$_2$Se/H$_2$ gas mixture at a flow rate of between 20 and 200 cm$^3$/min. For a dopant such as H$_2$Se concentrations of between 200 and 2000 ppm by volume in the H$_2$ are appropriate. The dopant containing gas flow is added to the combined HCl-Ga and AsH$_3$ flows in the reaction chamber.

Deposition of GaAs is continued until the desired thickness is obtained. Thicknesses of at least 1 $\mu$m are desirable to produce a reliable contact, while layers thicker than about 40 $\mu$m become unecomomical. Typically layers of between 5 and 10 $\mu$m of GaAs are deposited. These layers have average grain sizes of about 2-3$\mu$. When using Ge or Sn layers, GaAs films in this thickness range are pinhole free (100% area coverage). If a Si coating is used, area coverage between 90% and 95% is obtained. Even with Si if very thick layers of GaAs are grown, for example, 50-100$\mu$, a pinhole free layer is achievable. As discussed earlier, pinhole free layers are useful directly in devices such as liquid junctions, while layers with less area coverage are useful in contacting other semiconductor layers which cannot be deposited directly on conducting substrates to form low resistance contacts.

Example 1

A graphite substrate (type 5890 PT) was rinsed successively with trichlorethane and methanol, and then fired in a hydrogen atmosphere at 1000 degrees C. Half the substrate was masked with a thin stainless steel plate and the substrate along with a glass slide was then placed at the deposition position of an evaporation device manufactured by Veeco Corp. A tungsten boat was filled with elemental Ge, 99.999% pure. The device was evacuated to about $10^{-6}$ Torr and the temperature of the boat was slowly raised by resistance heating. The temperature was increased until evaporation of Ge, and thus deposition on the glass slide and graphite substrate, was indicated by monitoring a Kronos crystal gauge. The temperature was then maintained until the crystal gauge indicated a nominal thickness of about 500 Å. (A Taly-Surf gauge was also used to measure the nominal thickness of material deposited on the glass slide. This measurement indicated a similar value.)

The mask on one half of the substrate was removed and it was placed in the substrate position of an apparatus for GaAs deposition described by Tietjen and Amick, supra. A substrate temperature of 620 degrees C., was used, the Ga boat was heated to about 900 degrees C., The flow rates of the HCl and AsH$_3$ streams were each 200 and the total combined flow rate was 424 cm$^3$/min. No dopant was introduced. The deposition was continued until an n-type GaAs layer of approximately 8±3$\mu$ thickness was obtained. This took about 40 min. The GaAs layer had an n-type carrier concentration of about $10^{17}$ cm$^{-3}$.

The substrate was then removed and observed in a scanning electron microscope (SEM). A 100% area coverage was observed on the originally unmasked side of the graphite while the other side had area coverage less than 50%. (The micrograph is shown in FIG. 1.) An average grain size of 2$\mu$ was obtained. Electrical measurements were also taken which indicated a blocking voltage less than 0.05 V and a resistance of less than 1 ohm-cm$^2$ for the side having the Ge.

Example 2

Figure 2:
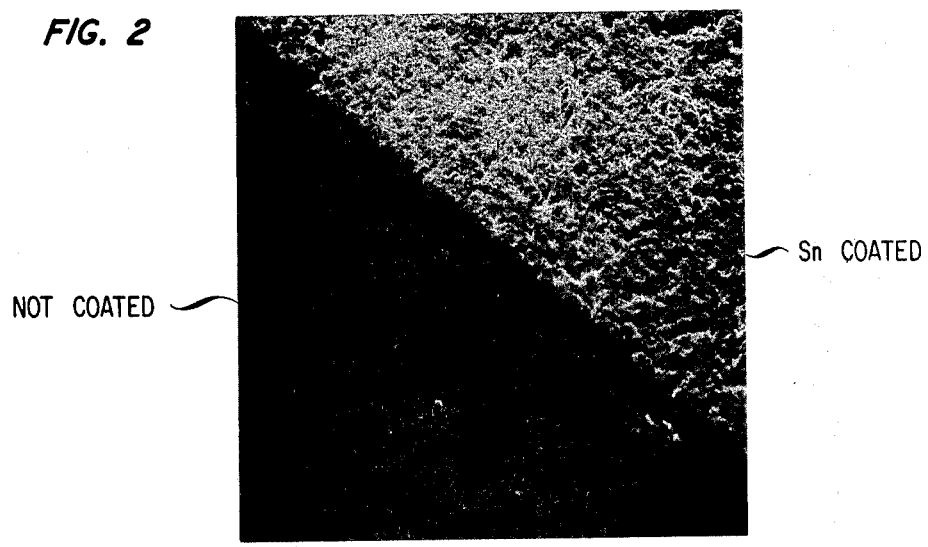

The same procedure was followed as described in example 1 except elemental Sn of 99.999% purity was used in the evaporation step. GaAs area coverage of 100% was again obtained as compared to less than 50% for the masked side. (See FIG. 2.) Blocking voltages of less than 0.05 V and a resistance of less than 0.01 ohm-cm$^2$ were similarly observed. Average grain sizes of 2$\mu$ and carrier concentrations of about $10^{17}$ cm$^{-3}$ were obtained.

Example 3

A graphite substrate was cleaned and masked as described in example 1. The substrate along with a glass slide was placed in a Rf sputtering apparatus manufactured by Material Research Corp. A Si target sold by the same company was placed in the apparatus and the deposition chamber was evacuated. An Ar atmosphere of approximately 100 $\mu$m was introduced and a Rf plasma was struck. Sputtering was continued until a nominal thickness of 520 A, as determined by a Taly-Surf measurement on the layer which was deposited on the glass slide was obtained. The mask was removed and the substrate was then placed in the CVD apparatus. Gallium arsenide was deposited as described in example 1.

Figure 3:
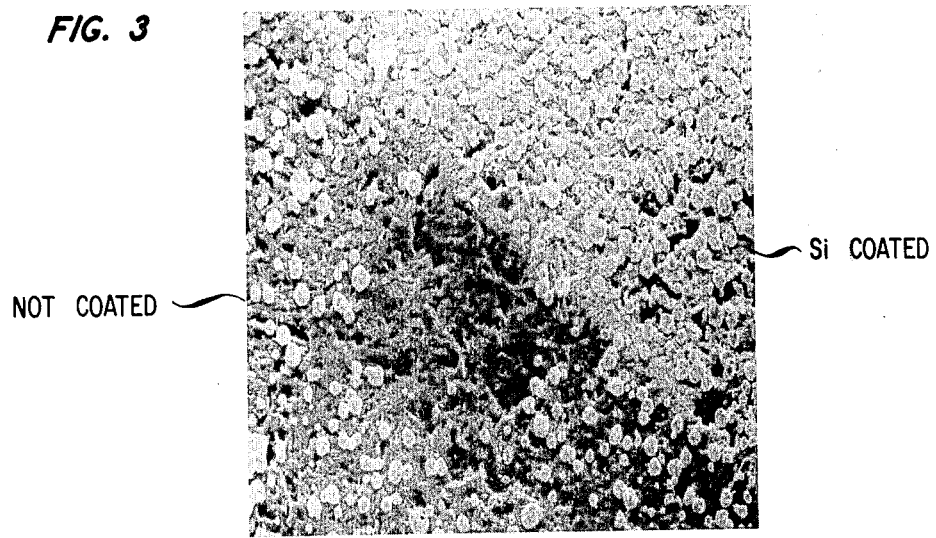

An area coverage of about 90% was obtained as compared to less than 50% for the masked side. (See FIG. 3.) Because of the pinholes, electrical measurement could not be accurately taken. To obtain a good indication of the electrical properties, samples grown with a 50$\mu$ to 100$\mu$ thick layer which were pinhole free were tested. A blocking voltage less than 0.05 V and a specific resistance of less than 0.01 ohm-cm$^2$ were obtained for these thicker samples.

What is claimed is:

1. A supported semiconductor layer comprising an n-type layer of GaAs deposited on and forming an interface with an electrically conductive body characterized in that said layer of GaAs is a polycrystalline layer and said electrically conductive body comprises an electrically conductive substrate having deposited thereon an elemental layer of nominal thickness in the range of 1000 to 250 Å, wherein said elemental layer is substantially only one element of the group consisting essentially of Ge, Sn, and Si and wherein the resistance of said interface is less than 2 ohm-cm$^2$, the blocking voltage is less than 0.05 V and said n-type layer of GaAs covers at least 90% of said electrically conductive body.

2. A supported semiconductor layer of claim 1 wherein said elemental layer is substantially only one element of the group consisting essentially of Ge and Sn.

3. A supported semiconductor layer of claim 2 wherein said nominal thickness of said elemental layer is in the range of 200 to 1000 Å.

4. A supported semiconductor layer of claim 2 wherein said elemental layer is deposited by evaporation.

5. A supported semiconductor layer of claim 2 wherein said elemental layer is deposited by sputtering.

6. A supported semiconductor layer of claim 2 wherein said electrically conductive substrate is graphite.

7. A supported semiconductor layer of claim 2 wherein said nominal thickness of said elemental layer is in the range of 400 to 600 Å.

8. A supported semiconductor layer of claim 1 wherein said elemental layer is substantially Si.

9. A supported semiconductor layer of claim 8 wherein the nominal thickness of said elemental layer is in the range of 400 to 600 Å.

10. A supported semiconductor layer of claim 8 wherein said elemental layer is deposited by sputtering.

11. A supported semiconductor layer of claim 1 wherein said elemental layer is substantially composed of Ge.

12. A supported semiconductor layer of claim 1 wherein said elemental layer is substantially composed of Sn.

13. A supported semiconductor layer of claim 1 wherein said electrically conductive substrate is graphite.

14. a supported semiconductor layer comprising a conducting substrate having deposited thereon in succession (1) a 250 to 1000 Å thick metal layer substantially comprising only one element of the group consisting essentially of Ge, Sn, and Si, and (2) a polycrystalline layer of n-type GaAs, wherein the resistance at the interface between said metal layer and said polycrystalline layer is less than 2 ohm-cm$^2$, the blocking voltage is less than 0.05 V, and said polycrystalline layer covers at least 90% of said conducting substrate.

15. A supported semiconductor layer of claim 14 wherein said conducting substrate is graphite.

16. The supported semiconductor layer of claim 11 wherein said GaAs layer covers 100% of said electrically conductive body.

17. The supported semiconductor layer of claim 12 wherein said GaAs layer covers 100% of said electrically conductive body.

* * * * *

UNITED STATES PATENT AND TRADEMARK OFFICE
CERTIFICATE OF CORRECTION

PATENT NO. : 4,213,801
DATED : July 22, 1980
INVENTOR(S) : Wilbur D. Johnston, Jr.

It is certified that error appears in the above—identified patent and that said Letters Patent is hereby corrected as shown below:

In the Title, "N-GAAS" should read --n-GaAs--. Column 2, line 25, "semiconducotr" should read --semiconductor--. Column 4, line 62, after "$AsH_3$", the words --in $H_2$-- should be added. Column 5, line 15, "700 degrees C.," should read --700 degrees C.--. Column 6, line 15, "The" should read --the--. Column 8, line 17, "a" should read --A--.

Signed and Sealed this

Twelfth Day of May 1981

[SEAL]

Attest:

RENE D. TEGTMEYER

*Attesting Officer*   *Acting Commissioner of Patents and Trademarks*